US012671384B2

(12) United States Patent
Levinger et al.

(10) Patent No.: US 12,671,384 B2
(45) Date of Patent: Jun. 30, 2026

(54) EDGE COMBINING SUB-HARMONIC N-PATH FILTER

(71) Applicant: Intel Corporation, Santa Clara, CA (US)

(72) Inventors: Run Levinger, Tel Aviv (IL); Soumya Gupta, Corvallis, OR (US); Sashank Krishnamurthy, Hillsboro, OR (US); Ashoke Ravi, Portland, OR (US); Ofir Degani, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/088,928

(22) Filed: Dec. 27, 2022

(65) Prior Publication Data

US 2024/0213947 A1 Jun. 27, 2024

(51) Int. Cl.
*H03H 7/01* (2006.01)
(52) U.S. Cl.
CPC ................................. *H03H 7/1758* (2013.01)
(58) Field of Classification Search
CPC ....................................................... H03H 7/17
See application file for complete search history.

(56) References Cited

U.S. PATENT DOCUMENTS

| | | | | |
|---|---|---|---|---|
| 9,461,680 B1 * | 10/2016 | Mirzaei | .................... | H04B 1/16 |
| 9,871,487 B2 * | 1/2018 | Lu | ......................... | H03D 7/1458 |
| 10,879,955 B2 * | 12/2020 | Nabki | .................... | H04B 1/719 |
| 11,539,387 B2 * | 12/2022 | Vazny | .................. | H04B 7/0413 |
| 2025/0105787 A1 * | 3/2025 | Wang | .................... | H03D 7/165 |

* cited by examiner

*Primary Examiner* — Andrea Lindgren Baltzell
*Assistant Examiner* — Alan Wong
(74) *Attorney, Agent, or Firm* — Schwegman Lundberg & Woessner, P.A.

(57) ABSTRACT

A filter includes a plurality of filtering paths. The plurality of filtering paths is driven by a corresponding plurality of local oscillator (LO) signals associated with an LO frequency. Each of the LO signals has a phase of a plurality of phases. Each filtering path of the plurality of filtering paths includes a plurality of signal generation branches. The plurality of signal generation branches is configured to receive a harmonic LO signal based on a fraction of the LO frequency, and generate an LO signal of the corresponding plurality of LO signals associated with the LO frequency using the harmonic LO signal.

20 Claims, 10 Drawing Sheets

100

WIRELESS RADIO CARD

102 — N-PATH FILTER 105
104
104A

WLAN FRONT-END MODULE (FEM) CIRCUITRY

103 — SWITCH

BT FRONT-END MODULE (FEM) CIRCUITRY

104B

101

106
106A

WLAN RADIO IC CIRCUITRY

BT RADIO IC CIRCUITRY

112

106B

WLAN-BT CO-EXISTENCE CIRCUITRY

114

108
108A

WLAN BASEBAND PROCESSING CIRCUITRY

BT BASEBAND PROCESSING CIRCUITRY

108B

APPLICATION PROCESSOR

111

$P(2\pi f_{in}t+\pi(1+2/(N*M)))$     $P(2\pi f_{in}t)$ $P(2\pi f_{in}t+\pi((M+2)/M+2/(M*N)))$     $P(2\pi f_{in}t+2\pi/M)$ $P(2\pi f_{in}t+\pi((M+4)/M+2/(M*N)))$     $P(2\pi f_{in}t+4\pi/M)$ $P(2\pi f_{in}t+\pi((M+6)/M+2/(M*N)))$     $P(2\pi f_{in}t+6\pi/M)$ $P(2\pi f_{in}t+\pi((M+8)/M+2/(M*N)))$     $P(2\pi f_{in}t+8\pi/M)$

M branches for multiplication by M $W(2\pi f_{in}t)$ $W(2\pi f_{in}t+2\pi/(N*M))$ N phase NPF $W(2\pi f_{in}t+4\pi/(N*M))$ $W(2\pi f_{in}t+6\pi/(N*M))$

FIG. 6

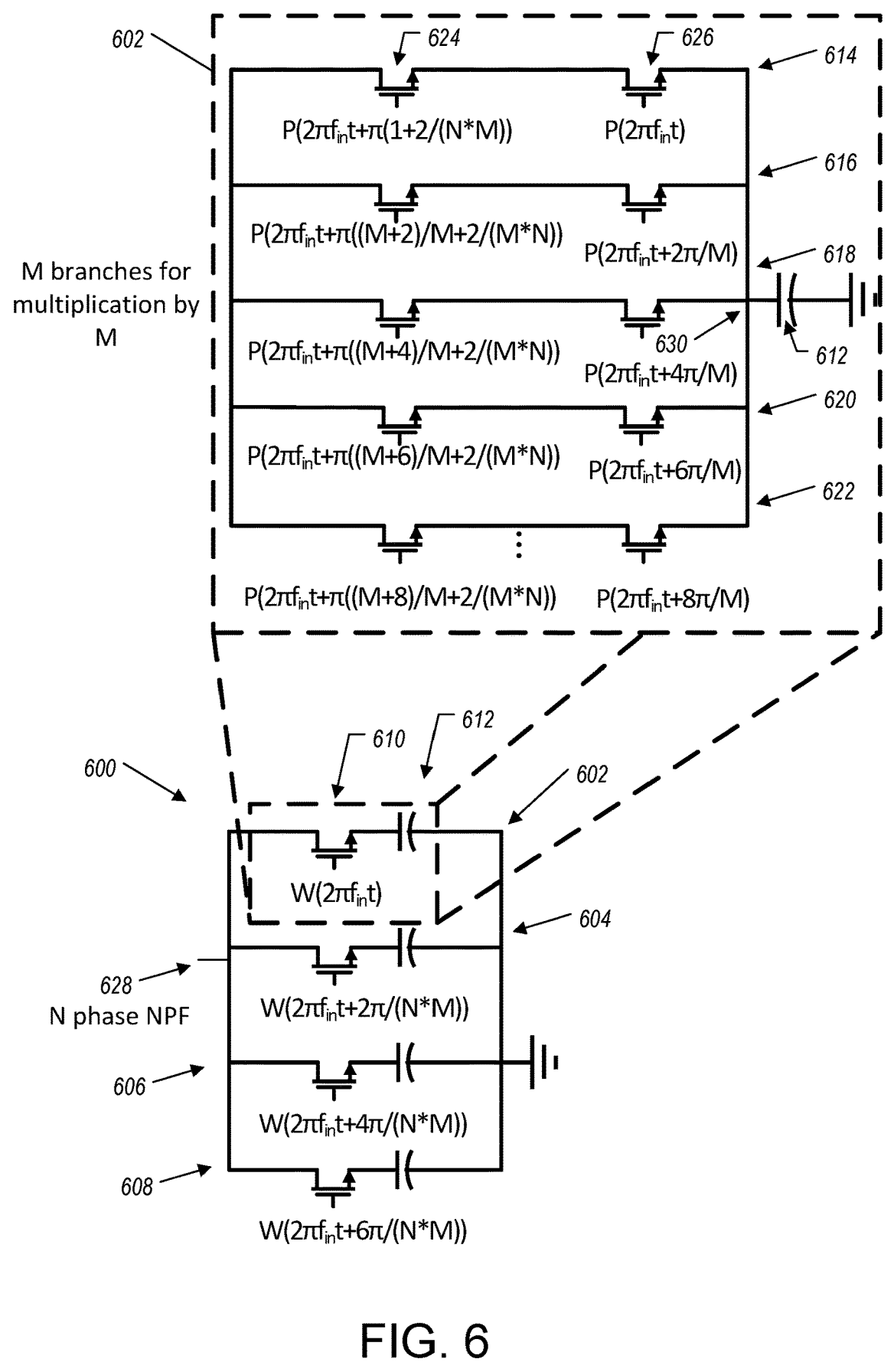

FREQ (GHz)

V (dB)

EDGE COMBINING SUB-HARMONIC N-PATH FILTER

TECHNICAL FIELD

Embodiments pertain to improvements in signal processing systems, including filtering techniques using an edge combining sub-harmonic N-path filter.

BACKGROUND

Mobile communications have evolved from early voice systems to today's highly sophisticated integrated communication platform. With the increase in different types of devices communicating with various network devices, the usage of 3GPP LTE systems has increased. The penetration of mobile devices (user equipment or UEs) in modern society has continued to drive demand for a wide variety of networked devices in many disparate environments. Fifth-generation (5G) wireless systems are forthcoming and are expected to enable even greater speed, connectivity, and usability. Next-generation 5G networks (or NR networks) are expected to increase throughput, coverage, and robustness and reduce latency and operational and capital expenditures. 5G-NR networks will continue to evolve based on 3GPP LTE-Advanced with additional potential new radio access technologies (RATs) to enrich people's lives with seamless wireless connectivity solutions delivering fast, rich content and services. As the current cellular network frequency is saturated, higher frequencies, such as millimeter wave (mmWave) frequency, can be beneficial due to their high bandwidth.

Potential LTE operation in the unlicensed spectrum includes (and is not limited to) the LTE operation in the unlicensed spectrum via dual connectivity (DC), or DC-based LAA, and the standalone LTE system in the unlicensed spectrum, according to which LTE-based technology solely operates in the unlicensed spectrum without requiring an "anchor" in the licensed spectrum, called MulteFire. Further enhanced operation of LTE and NR systems in the licensed, as well as unlicensed spectrum, is expected in future releases as well as WiGig and mmW systems. Such enhanced operations can include techniques for supporting signal filtering using an edge combining sub-harmonic N-path filter.

BRIEF DESCRIPTION OF THE DRAWINGS

In the drawings, like numerals may describe the same or similar components or features in different views. Like numerals having different letter suffixes may represent different instances of similar components. Some embodiments are illustrated by way of example, and not limitation, in the figures of the accompanying drawings in which:

FIG. 6 is a block diagram of an example edge combining sub-harmonic N-path filter with M signal generation branches, in accordance with some embodiments;

DETAILED DESCRIPTION

Figure 1:
FIG. 1 is an exemplary block diagram of a radio architecture including an interface card with an N-path filter, in accordance with some embodiments.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc., to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

The following description and the drawings sufficiently illustrate specific embodiments to enable those skilled in the art to practice them. Other embodiments may incorporate structural, logical, electrical, process, and other changes. Portions and features of some embodiments may be included in or substituted for, those of other embodiments. Embodiments outlined in the claims encompass all available equivalents of those claims.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing devices, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one aspect", "an aspect", "an example aspect", "some aspects", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or any other manner.

Some aspects may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a sensor device, an Internet of Things (IoT) device, a wearable device, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some aspects may, for example, be used in conjunction with devices and/or networks operating in accordance with existing IEEE 802.11 standards (including IEEE 802.11-2016 (IEEE 802.11-2016, IEEE Standard for Information technology—Telecommunications and information exchange between systems Local and metropolitan area networks—Specific requirements Part 11: Wireless LAN Medium Access Control (MAC) and Physical Layer (PHY) Specifications, Dec. 7, 2016); IEEE802.11ay (P802.11ay Standard for Information Technology—Telecommunications and Information Exchange Between Systems Local and Metropolitan Area Networks—Specific Requirements Part 11: Wireless LAN Medium Access Control (MAC) and Physical Layer (PHY) Specifications—Amendment: Enhanced Throughput for Operation in License-Exempt Bands Above 45 GHz)) and/or future versions and/or derivatives thereof, devices and/or networks operating in accordance with existing WiFi Alliance (WFA) Peer-to-Peer (P2P) specifications (including WiFi P2P technical specification, version 1.5, Aug. 4, 2015) and/or future versions and/or derivatives thereof, devices and/or networks operating in accordance with existing Wireless-Gigabit-Alliance (WGA) specifications (including Wireless Gigabit Alliance, Inc WiGig MAC and PHY Specification Version 1.1, April 2011, Final specification) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some aspects may be used in conjunction with one-way and/or two-way radio communication systems, cellular radiotelephone communication systems, a mobile phone, a cellular telephone, wireless telephone, a Personal Communication Systems (PCS) device, a PDA device that incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), FDM Time-Division Multiplexing (TDM), Time-Division Multiple Access (TDMA), Multi-User MIMO (MU-MIMO), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems, and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that is integrated with a computer, or a peripheral that is attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting and/or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device.

Some demonstrative aspects may be used in conjunction with a WLAN, e.g., a WiFi network. Other aspects may be used in conjunction with any other suitable wireless communication network, for example, a wireless area network, a "piconet", a WPAN, a WVAN, and the like.

Some demonstrative aspects may be used in conjunction with a wireless communication network communicating over a frequency band above 45 Gigahertz (GHz), e.g., 60 GHz. However, other aspects may be implemented utilizing any other suitable wireless communication frequency bands, for example, an Extremely High Frequency (EHF) band (the millimeter wave (mmWave) frequency band), e.g., a frequency band within the frequency band between 20 GHz and 300 GHz, a frequency band above 45 GHz, a frequency band below 20 GHz, e.g., a Sub 1 GHz (S1G) band, a 2.4 GHz band, a 5 GHz band, a WLAN frequency band, a WPAN frequency band, a frequency band according to the WGA specification, and the like.

As used herein, the term "circuitry" may, for example, refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some aspects, the circuitry may include logic, at least partially operable in hardware. In some aspects, the circuitry may be implemented as part of and/or in the form of a radio virtual machine (RVM), for example, as part of a Radio processor (RP) configured to execute code to configure one or more operations and/or functionalities of one or more radio components.

The term "logic" may refer, for example, to computing logic embedded in the circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read-only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna", as used herein, may include any suitable configuration, structure, and/or arrangement of one or more antenna elements, components, units, assemblies, and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

Some demonstrative aspects are described herein with respect to WiFi communication. However, other aspects may be implemented with respect to any other communication scheme, network, standard, and/or protocol.

In some demonstrative aspects, a wireless communication device may implement a millimeter wave (mmWave) radio front-end module (RFEM), e.g., as described below. The term RFEM is used interchangeably with the term front-end module (FEM) or FEM circuitry.

Millimeter wave may be defined as a frequency range spanning about 30 GHz to about 300 GHz, and in practice currently covers several discrete licensed and unlicensed frequency bands.

The unlicensed mmWave frequency band currently available is in the vicinity of 60 GHz. Licensed frequency bands are likely to include 28 GHz, 39 GHz, 73 GHz, and 120 GHz. The availability of these bands and the specific frequency range of each varies by regulatory jurisdiction, and in some cases (specifically for licensed band operation) there is still significant uncertainty as to regulations in some countries. Challenges associated with mmWave-based cellular communications include limited range, the directionality of antennas of the range, signal loss because of the use of regular cables instead of traces, and challenges with integrating multiple antennas for beamforming. These challenges are addressed in this patent as discussed below in accordance with some aspects and may include the use of polarization innovations, trace, and other line use to avoid signal loss and an improved ability for use in beamforming.

FIG. 1 is a block diagram of a radio architecture 100 including an interface card 102 with an N-path filter 105, in accordance with some embodiments. The radio architecture 100 may be implemented in a computing device (e.g., device 900 in FIG. 9, device 1000 in FIG. 10, or base station 1100 in FIG. 11) including user equipment (UE), a base station (e.g., a next-generation Node-B (gNB), enhanced Node-B (eNB)), a smartphone, a personal computer (PC), a laptop, a tablet, or another type of wired or wireless device. The radio architecture 100 may include radio front-end module (FEM) circuitry 104, radio integrated circuit (IC) circuitry 106, and baseband processing circuitry 108 configured as part of the interface card 102. In this regard, radio architecture 100 (as shown in FIG. 1) includes an interface card 102 configured to perform both Wireless Local Area Network (WLAN) functionalities and Bluetooth (BT) functionalities (e.g., as WLAN/BT interface or modem card), although embodiments are not so limited and the disclosed techniques apply to other types of radio architectures with different types of interface cards as well. In this disclosure, "WLAN" and "Wi-Fi" are used interchangeably. Other example types of interface cards which can be used in connection with the disclosed techniques include graphics cards, network cards, SSD cards (such as M.2-based cards), CEM-based cards, etc.

FEM circuitry 104 may include a WLAN or Wi-Fi FEM circuitry 104A and a Bluetooth (BT) FEM circuitry 104B. The WLAN FEM circuitry 104A may include a receive signal path comprising circuitry configured to operate on WLAN RF signals received from one or more antennas 101, to amplify the received signals, and to provide the amplified versions of the received signals to the WLAN radio IC circuitry 106A for further processing. The BT FEM circuitry 104B may include a receive signal path which may include circuitry configured to operate on BT RF signals received from the one or more antennas 101, to amplify the received signals, and to provide the amplified versions of the received signals to the BT radio IC circuitry 106B for further processing. The WLAN FEM circuitry 104A may also include a transmit signal path which may include circuitry configured to amplify WLAN signals provided by the radio IC circuitry 106A for wireless transmission by the one or more antennas 101. Besides, the BT FEM circuitry 104B may also include a transmit signal path which may include circuitry configured to amplify BT signals provided by the radio IC circuitry 106B for wireless transmission by the one or more antennas. In the embodiment of FIG. 1, although WLAN FEM circuitry 104A and BT FEM circuitry 104B are shown as being distinct from one another, embodiments are not so limited and include within their scope the use of a FEM (not shown) that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 106 as shown may include WLAN radio IC circuitry 106A and BT radio IC circuitry 106B. The WLAN radio IC circuitry 106A may include a receive signal path which may include circuitry to down-convert WLAN RF signals received from the WLAN FEM circuitry 104A and provide baseband signals to WLAN baseband processing circuitry 108A. The BT radio IC circuitry 106B may, in turn, include a receive signal path which may include circuitry to down-convert BT RF signals received from the BT FEM circuitry 104B and provide baseband signals to BT baseband processing circuitry 108B. The WLAN radio IC circuitry 106A may also include a transmit signal path which may include circuitry to up-convert WLAN baseband signals provided by the WLAN baseband processing circuitry 108A and provide WLAN RF output signals to the WLAN FEM circuitry 104A for subsequent wireless transmission by the one or more antennas 101. The BT radio IC circuitry 106B may also include a transmit signal path which may include circuitry to up-convert BT baseband signals provided by the BT baseband processing circuitry 108B and provide BT RF output signals to the BT FEM circuitry 104B for subsequent wireless transmission by the one or more antennas 101. In the embodiment of FIG. 1, although radio IC circuitries 106A and 106B are shown as being distinct from one another, embodiments are not so limited and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuitry 108 may include a WLAN baseband processing circuitry 108A and a BT baseband processing circuitry 108B. The WLAN baseband processing circuitry 108A may include a memory, such as, for example, a set of RAM arrays in a Fast Fourier Transform (FFT) or Inverse Fast Fourier Transform (IFFT) block (not shown) of the WLAN baseband processing circuitry 108A. Each of the WLAN baseband processing circuitry 108A and the BT baseband processing circuitry 108B may further include one or more processors and control logic to process the signals received from the corresponding WLAN or BT receive signal path of the radio IC circuitry 106, and to also generate corresponding WLAN or BT baseband signals for the transmit signal path of the radio IC circuitry 106. Each of the baseband processing circuitries 108A and 108B may further include a physical layer (PHY) and medium access control layer (MAC) circuitry and may further interface with a host processor (e.g., the application processor 111) in a host system (e.g., a host SoC) for generation and processing of the baseband signals and for controlling operations of the radio IC circuitry 106.

Referring still to FIG. 1, according to the shown embodiment, WLAN-BT coexistence circuitry 114 may include logic providing an interface between the WLAN baseband processing circuitry 108A and the BT baseband processing circuitry 108B to enable use cases requiring WLAN and BT coexistence. In addition, a switch 103 may be provided between the WLAN FEM circuitry 104A and the BT FEM circuitry 104B to allow switching between the WLAN and BT radios according to application needs. In addition, although the one or more antennas 101 are depicted as being respectively connected to the WLAN FEM circuitry 104A and the BT FEM circuitry 104B, embodiments include within their scope the sharing of the one or more antennas 101 as between the WLAN and BT FEMs, or the provision of more than one antenna connected to each of FEM circuitries 104A or 104B.

In some embodiments, the front-end module circuitry 104, the radio IC circuitry 106, and the baseband processing circuitry 108 may be provided on a single radio card, such as the interface card 102. In some other embodiments, the one or more antennas 101, the FEM circuitry 104, and the radio IC circuitry 106 may be provided on a single radio card. In some other embodiments, the radio IC circuitry 106 and the baseband processing circuitry 108 may be provided on a single chip or IC, such as IC 112.

In some embodiments, the interface card 102 can be configured as a wireless radio card, such as a WLAN radio card configured for wireless communications (e.g., WiGig communications in the 60 GHz range or mmW communications in the 24.24 GHz-52.6 GHz range), although the scope of the embodiments is not limited in this respect. In some of these embodiments, the radio architecture 100 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers.

In some embodiments, the interface card 102 may include one or more filters such as N-path filter 105 configured based on the disclosed functionalities (e.g., the functionalities discussed in connection with FIGS. 5-10). Even though FIG. 1 illustrates a single N-path filter 105, the disclosure is not limited in this regard and the disclosed N-path filter can be implemented in different configurations at different circuitries (e.g., as an RF filter in the FEM circuitry 104, as a downconversion mixer in the FEM circuitry 104, or a different circuitry disclosed herein). A more detailed description of disclosed N-path filter configurations is provided in connection with, e.g., FIGS. 5-10.

In some of these multicarrier embodiments, radio architecture 100 may be part of a Wi-Fi communication station (STA) such as a wireless access point (AP), a base station, or a mobile device including a Wi-Fi-enabled device. In some of these embodiments, radio architecture 100 may be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.11ac, IEEE 802.11-2016, 802.1 lad, and/or 802.1 lax standards and/or proposed specifications for WLANs, although the scope of embodiments is not limited in this respect and operations using other wireless standards can also be configured. Radio architecture 100 may also be suitable to transmit and/or receive communications in accordance with other techniques and standards, including a 3$^{rd}$ Generation Partnership Project (3GPP) standard, including a communication standard used in connection with 5G or new radio (NR) communications.

In some embodiments, the radio architecture 100 may be configured for high-efficiency (HE) Wi-Fi communications in accordance with the IEEE 802.1 lax standard or another standard associated with wireless communications. In these embodiments, the radio architecture 100 may be configured to communicate in accordance with an OFDMA technique, although the scope of the embodiments is not limited in this respect.

In some other embodiments, the radio architecture 100 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, as further shown in FIG. 1, the BT baseband processing circuitry 108B may be compliant with a Bluetooth (BT) connectivity standard such as Bluetooth, Bluetooth 4.0 or Bluetooth 5.0, or any other iteration of the Bluetooth Standard. In embodiments that include BT functionality as shown for example in FIG. 1, the radio architecture 100 may be configured to establish a BT synchronous connection-oriented (SCO) link and or a BT low energy (BT LE) link. In some of the embodiments that include functionality, the radio architecture 100 may be configured to establish an extended SCO (eSCO) link for BT communications, although the scope of the embodiments is not limited in this respect. In some of these embodiments that include a BT functionality, the radio architecture may be configured to engage in a BT Asynchronous Connection-Less (ACL) communications, although the scope of the embodiments is not limited in this respect. In some embodiments, as shown in FIG. 1, the functions of a BT radio card and WLAN radio card may be combined on a single wireless radio card, such as the interface card 102, although embodiments are not so limited, and include within their scope discrete WLAN and BT radio cards In some embodiments, the radio architecture 100 may include other radio cards, such as a cellular radio card configured for cellular/wireless communications (e.g., 3GPP such as LTE, LTE-Advanced, WiGig, or 5G communications including mmW communications), which may be implemented together with (or as part of) the interface card 102.

In some IEEE 802.11 embodiments, the radio architecture 100 may be configured for communication over various channel bandwidths including bandwidths having center frequencies of about 900 MHz, 2.4 GHz, 5 GHz, and bandwidths of about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some embodiments, a 320 MHz channel bandwidth may be used. The scope of the embodiments is not limited with respect to the above center frequencies, however.

Figure 2:
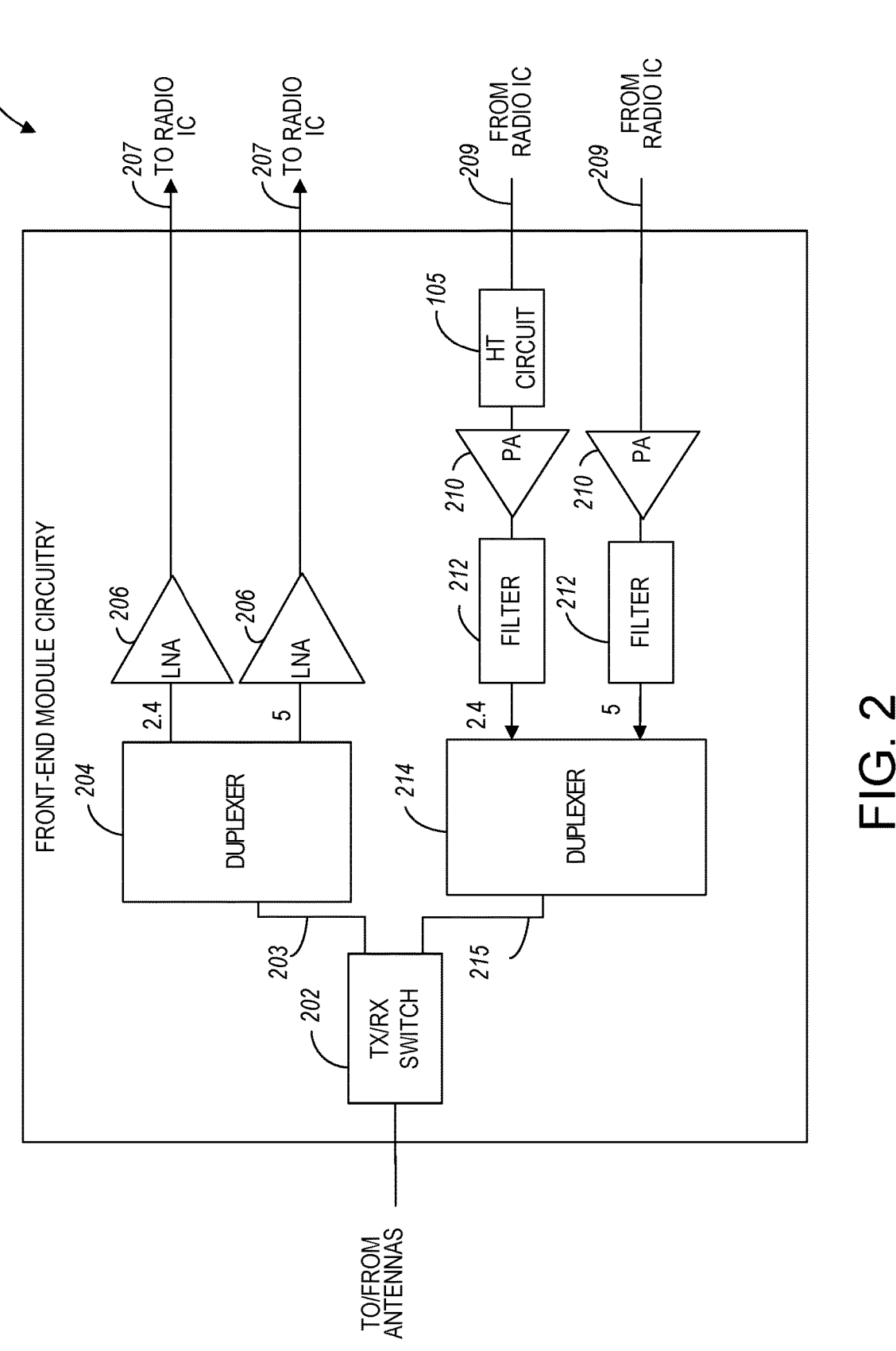
FIG. 2 illustrates a front-end module circuitry for use in the radio architecture of FIG. 1, in accordance with some embodiments.

FIG. 2 illustrates FEM circuitry 200 in accordance with some embodiments. The FEM circuitry 200 is one example of circuitry that may be suitable for use as the WLAN and/or BT FEM circuitry 104A/104B (FIG. 1), although other circuitry configurations may also be suitable.

In some embodiments, the FEM circuitry 200 may include a TX/RX switch 202 to switch between transmit (TX) mode and receive (RX) mode operation. In some aspects, a diplexer may be used in place of a TX/RX switch. The FEM circuitry 200 may include a receive signal path and a transmit signal path. The receive signal path of the FEM circuitry 200 may include a low-noise amplifier (LNA) 206 to amplify received RF signals 203 and provide the amplified received RF signals 207 as an output (e.g., to the radio IC circuitry 106 (FIG. 1)). The transmit signal path of the FEM circuitry 200 may include a power amplifier (PA) to amplify input RF signals 209 (e.g., provided by the radio IC circuitry 106), and one or more filters 212, such as band-pass filters (BPFs), low-pass filters (LPFs) or other types of filters, to generate RF signals 215 for subsequent transmission (e.g., by the one or more antennas 101 (FIG. 1)).

In some dual-mode embodiments for Wi-Fi communication, the FEM circuitry 200 may be configured to operate in, e.g., either the 2.4 GHz frequency spectrum or the 5 GHz frequency spectrum. In these embodiments, the receive signal path of the FEM circuitry 200 may include a receive signal path duplexer 204 to separate the signals from each spectrum as well as provide a separate LNA 206 for each spectrum as shown. In these embodiments, the transmit signal path of the FEM circuitry 200 may also include a power amplifier (PA) 210 and one or more filters 212, such as a BPF, an LPF, or another type of filter for each frequency spectrum, and a transmit signal path duplexer 214 to provide the signals of one of the different spectrums onto a single transmit path for subsequent transmission by the one or more antennas 101 (FIG. 1). In some embodiments, BT communications may utilize the 2.4 GHz signal paths and may utilize the same FEM circuitry 200 as the one used for WLAN communications.

Figure 3:
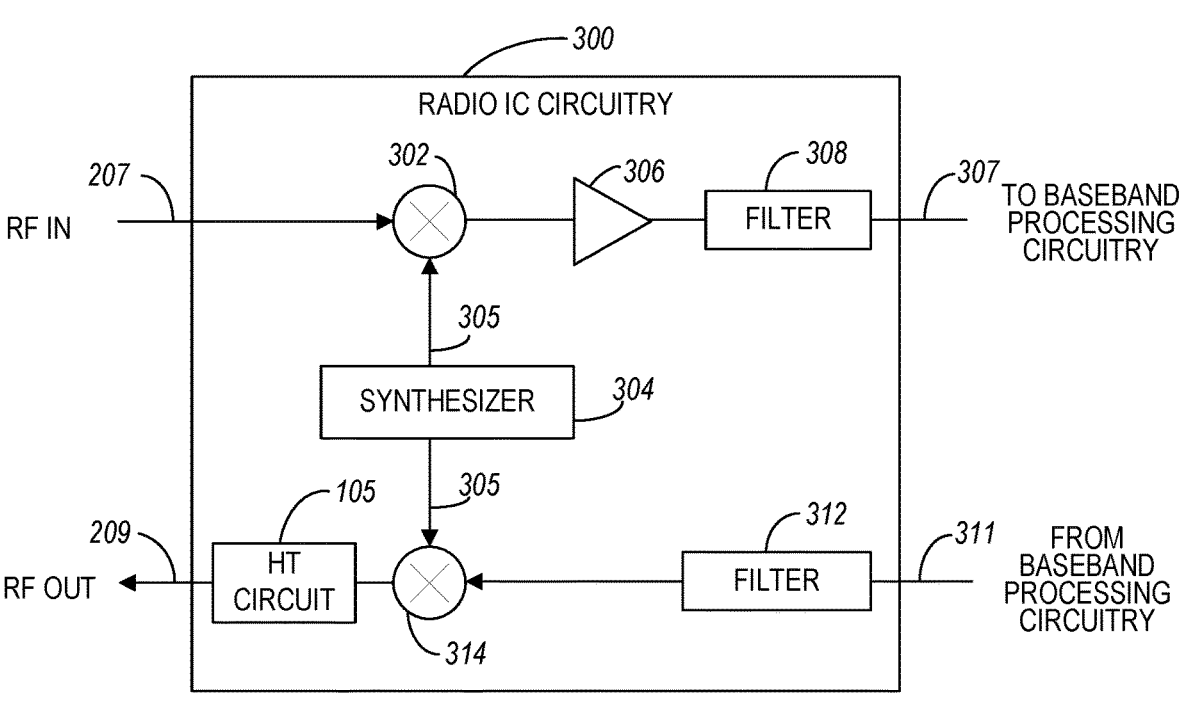
FIG. 3 illustrates a radio IC circuitry for use in the radio architecture of FIG. 1, in accordance with some embodiments.

FIG. 3 illustrates radio IC circuitry 300 in accordance with some embodiments. The radio IC circuitry 300 is one example of circuitry that may be suitable for use as the WLAN or BT radio IC circuitry 106A/106B (FIG. 1), although other circuitry configurations may also be suitable.

In some embodiments, the radio IC circuitry 300 may include a receive signal path and a transmit signal path. The receive signal path of the radio IC circuitry 300 may include mixer circuitry 302, such as, for example, down-conversion mixer circuitry, amplifier circuitry 306, and filter circuitry 308. The transmit signal path of the radio IC circuitry 300 may include at least filter circuitry 312 and mixer circuitry 314, such as up-conversion mixer circuitry. Radio IC circuitry 300 may also include synthesizer circuitry 304 for synthesizing a frequency 305 for use by the mixer circuitry 302 and the mixer circuitry 314. The mixer circuitry 302 and/or 314 may each, according to some embodiments, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 3 illustrates only a simplified version of a radio IC circuitry and may include, although not shown, embodiments where each of the depicted circuitries may include more than one component. For instance, mixer circuitry 302 and/or 314 may each include one or more mixers, and filter circuitries 308 and/or 312 may each include one or more filters, such as one or more BPFs and/or LPFs according to application needs. For example, when mixer circuitries are of the direct-conversion type, they may each include two or more mixers.

In some embodiments, mixer circuitry 302 may be configured to down-convert RF signals 207 received from the FEM circuitry 104 (FIG. 1) based on the synthesized frequency 305 provided by the synthesizer circuitry 304. The amplifier circuitry 306 may be configured to amplify the down-converted signals and the filter circuitry 308 may include an LPF configured to remove unwanted signals from the down-converted signals to generate output baseband signals 307. Output baseband signals 307 may be provided to the baseband processing circuitry 108 (FIG. 1) for further processing. In some embodiments, the output baseband signals 307 may be zero-frequency baseband signals, although this is not a requirement. In some embodiments, mixer circuitry 302 may comprise passive mixers, although the scope of the embodiments is not limited in this respect.

In some embodiments, the mixer circuitry 314 may be configured to up-convert input baseband signals 311 based on the synthesized frequency 305 provided by the synthesizer circuitry 304 to generate the input RF signals 209 for the FEM circuitry 104. The baseband signals 311 may be provided by the baseband processing circuitry 108 and may be filtered by filter circuitry 312. The filter circuitry 312 may include an LPF or a BPF, although the scope of the embodiments is not limited in this respect.

In some embodiments, the mixer circuitry 302 and the mixer circuitry 314 may each include two or more mixers and may be arranged for quadrature down-conversion and/or up-conversion respectively with the help of the synthesizer circuitry 304. In some embodiments, the mixer circuitry 302 and the mixer circuitry 314 may each include two or more mixers each configured for image rejection (e.g., Hartley image rejection). In some embodiments, the mixer circuitry 302 and the mixer circuitry 314 may be arranged for direct down-conversion and/or direct up-conversion, respectively. In some embodiments, the mixer circuitry 302 and the mixer circuitry 314 may be configured for super-heterodyne operation, although this is not a requirement.

Mixer circuitry 302 may comprise, according to one embodiment: quadrature passive mixers (e.g., for the in-phase (I) and quadrature-phase (Q) paths). In such an embodiment, RF input signal 207 from FIG. 2 may be down-converted to provide I and Q baseband output signals to be sent to the baseband processor.

Quadrature passive mixers may be driven by zero and ninety-degree time-varying LO switching signals provided by a quadrature circuitry which may be configured to receive a LO frequency ($f_{LO}$) from a local oscillator or a synthesizer, such as synthesized frequency (or LO frequency) 305 of synthesizer circuitry 304 (FIG. 3). In some embodiments, the LO frequency may be the carrier frequency, while in other embodiments, the LO frequency may be a fraction of the carrier frequency (e.g., one-half the carrier frequency, one-third the carrier frequency). In some embodiments, the zero and ninety-degree time-varying switching signals may be generated by the synthesizer, although the scope of the embodiments is not limited in this respect.

In some embodiments, the LO signals may differ in the duty cycle (the percentage of one period in which the LO signal is high) and/or offset (the difference between the start points of the period). In some embodiments, the LO signals may have a 25% duty cycle and a 50% offset. In some embodiments, each branch of the mixer circuitry (e.g., the in-phase (I) and quadrature-phase (Q) path) may operate at a 25% duty cycle, which may result in a significant reduction in power consumption.

The RF input signal 207 (FIG. 2) may comprise a balanced signal, although the scope of the embodiments is not limited in this respect. The I and Q baseband output signals may be provided to the low-noise amplifier, such as amplifier circuitry 306 (FIG. 3) or filter circuitry 308 (FIG. 3).

In some embodiments, the output baseband signals 307 and the input baseband signals 311 may be analog, although the scope of the embodiments is not limited in this respect. In some alternate embodiments, the output baseband signals 307 and the input baseband signals 311 may be digital. In these alternate embodiments, the radio IC circuitry may include an analog-to-digital converter (ADC) and digital-to-analog converter (DAC) circuitry.

In some dual-mode embodiments, a separate radio IC circuitry may be provided for processing signals for each spectrum, or for other spectrums not mentioned here, although the scope of the embodiments is not limited in this respect.

In some embodiments, the synthesizer circuitry 304 may be a fractional-N synthesizer or a fractional N/N+1 synthesizer, although the scope of the embodiments is not limited in this respect as other types of frequency synthesizers may be suitable. In some embodiments, the synthesizer circuitry 304 may be a delta-sigma synthesizer, a frequency multiplier, or a synthesizer comprising a phase-locked loop with a frequency divider. According to some embodiments, the synthesizer circuitry 304 may include a digital frequency synthesizer circuitry. An advantage of using a digital synthesizer circuitry is that, although it may still include some analog components, its footprint may be scaled down much more than the footprint of an analog synthesizer circuitry. In some embodiments, frequency input into synthesizer circuitry 304 may be provided by a voltage-controlled oscillator (VCO), although that is not a requirement. A divider control input may further be provided by either the baseband processing circuitry 108 (FIG. 1) or the application processor 111 (FIG. 1) depending on the desired frequency output as synthesized frequency 305. In some embodiments, a divider control input (e.g., N) may be determined from a look-up table (e.g., within a Wi-Fi card) based on a channel number and a channel center frequency as determined or indicated by the application processor 111.

In some embodiments, synthesizer circuitry 304 may be configured to generate a carrier frequency as the synthesized frequency 305, while in other embodiments, the synthesized frequency 305 may be a fraction of the carrier frequency (e.g., one-half the carrier frequency, one-third of the carrier frequency). In some embodiments, the synthesized frequency 305 may be a LO frequency (fLO). In some aspects, synthesizer circuitry 304 (also referred to as LO 304) can generate LO signals (e.g., at sub-harmonic frequencies of mmW LO signals) in connection with filtering configurations discussed herein.

Figure 4:
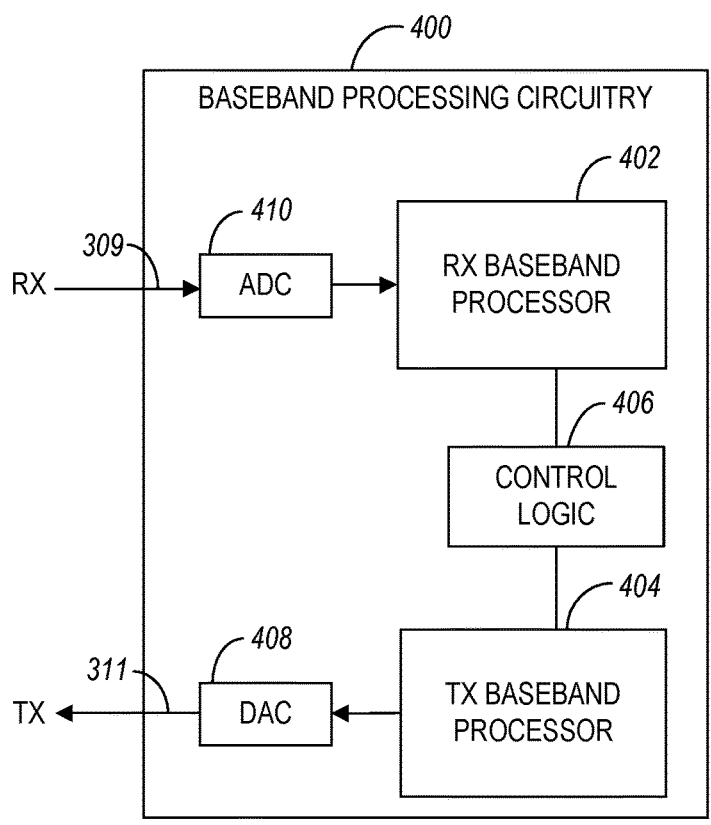
FIG. 4 illustrates a baseband processing circuitry for use in the radio architecture of FIG. 1, in accordance with some embodiments.

FIG. 4 illustrates a baseband processing circuitry 400 for use in the radio architecture of FIG. 1, in accordance with some embodiments. The baseband processing circuitry 400 is one example of circuitry that may be suitable for use as the baseband processing circuitry 108 (FIG. 1), although other circuitry configurations may also be suitable. The baseband processing circuitry 400 may include a receive baseband processor (RX BBP) 402 for processing receive baseband signals 309 provided by the radio IC circuitry 106 (FIG. 1) and a transmit baseband processor (TX BBP) 404 for generating baseband signals 311 for the radio IC circuitry 106. The baseband processing circuitry 400 may also include control logic 406 for coordinating the operations of the baseband processing circuitry 400.

In some embodiments (e.g., when analog baseband signals are exchanged between the baseband processing circuitry 400 and the radio IC circuitry 106), the baseband processing circuitry 400 may include an analog-to-digital converter (ADC) 410 to convert analog baseband signals 309 received from the radio IC circuitry 106 to digital baseband signals for processing by the RX BBP 402. In these embodiments, the baseband processing circuitry 400 may also include a digital-to-analog converter (DAC) 408 to convert digital baseband signals from the TX BBP 404 to analog baseband signals 311.

In some embodiments that communicate OFDM signals or OFDMA signals, such as through the WLAN baseband processing circuitry 108A, the TX BBP 404 may be configured to generate OFDM or OFDMA signals as appropriate for transmission by performing an inverse fast Fourier transform (IFFT). The RX BBP 402 may be configured to process received OFDM signals or OFDMA signals by performing an FFT. In some embodiments, the RX BBP 402 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 1, in some embodiments, the one or more antennas 101 (FIG. 1) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result. The one or more antennas 101 may each include a set of phased-array antennas, although embodiments are not so limited.

Although the radio architecture 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application-specific integrated circuits (ASICs), radio-frequency integrated circuits (RFICs), and combinations of various hardware and logic circuitry for performing at least the functions described herein. In some embodiments, the functional elements may refer to one or more processes operating on one or more processing elements.

N-path filtering is a technique that allows for a flexible and compact implementation of a channel selective bandpass filter at radio frequency (RF) and can be an efficient way to cope with challenging interferers. By attenuating the undesired out-of-channel signal early in the receiver lineup, it also supports concurrent transmit and receive operation which is important in communication and sensing usage scenarios.

Implementing an N-path filter can be based on the generation of several phases of a clock signal with a certain relation that can be challenging to obtain. In addition, optimum noise and linearity performance can be based on the switches being driven by square wave pulses, and the overlap between these clock phases be minimized. At mmW frequencies, the issues of synthesizing these signals are exacerbated by the high frequency and the power and jitter constraints of the system.

The disclosed techniques include an N-path filter architecture that allows obtaining the same desired functionality at mmW frequencies without the need to directly create square pulses with the different phases at mmW frequencies. Instead, the disclosed N-path filter uses more phases but at a fraction of the mmW frequency (e.g., at sub-harmonic frequencies), and leverages the ability to manipulate phases digitally with high resolution, low jitter, and power consumption at lower frequencies.

Previous solutions involve multi-phase signal generation at mmW frequencies such as (a) polyphase filters; (b) quadrature oscillator-based PLLs; and (c) cascades of quadrature/multi-phase frequency doublers/triplers. These prior approaches, however, either drive the N-path filter switches with a large swing or use additional stages of overdriven RF amplifiers to limit/clip the sinusoidal mmW local oscillator (LO) (clock) signals to approximate square wave/switching behavior.

In some aspects, N-path filters have stringent requirements on the slew rate and phase relation of the driving signals at each one of its branches. Creating such signals at mmW frequencies can be challenging (e.g., due to phasing, overlap, and jitter), and usually not power efficient, no matter the architecture used. In addition to the LO generation, distributing these signals with precise phase relations to the N-path filter is also "power hungry" and inefficient. The large amplitude required to satisfy the expected slew rate might cause reliability issues. The loading of all the branches at mmW frequencies is yet another challenge that impacts phase control. As the number of required phases increases, so do the challenges. Finally, all prior solutions tend to use a large number of passives in the phase generation and RF amplification stages, increasing the die area and cost.

The disclosed techniques can include the configuration of high-order digitally tunable band-pass filters that are built by summing up multiple N-path filters, each driven by different LO frequencies, which are precisely controlled by a DTC-based frequency synthesizer and spaced closely around the center frequency of the channel of interest. The individual N-path filter components (e.g., a capacitor and a switch) and spacing between the LO frequencies can be varied to achieve tunable bandwidth directly at RF. To avoid the need to generate multiple phases at mmW frequencies, the disclosed techniques use a plurality of phases at a fraction of the required frequency and, by connecting these in the manner specified herein, utilize edge combining that mimics the same operation at the wanted mmW frequency without the need to generate mmW LO signals.

The disclosed techniques include a sub-harmonic N path filter with the configurations described herein. The advantages of filtering architectures based on the disclosed techniques include the following:

(a) Avoiding mmW frequency generation with multiple phases that satisfy the requirements for proper switching of the NPF. The disclosed techniques can include generating the phases at a lower frequency where precise control at low power and area is feasible.

(b) Added flexibility/configurability for the N-path filter (e.g., configurability of order, bandwidth, ripple, etc.) through the LO scheme, since it can be based on switch configuration and the number of phases required.

(c) Compatible with localized generation at the individual N-path filter instances without needing distribution of the mmW LO signals from a centralized clock generation block. In some aspects, only the sub-harmonic LO signal may be distributed between the multiple N-path filter instances.

Figure 5:
FIG. 5 is a block diagram of an example N-path filter with N=4, in accordance with some embodiments.
Figure 5:
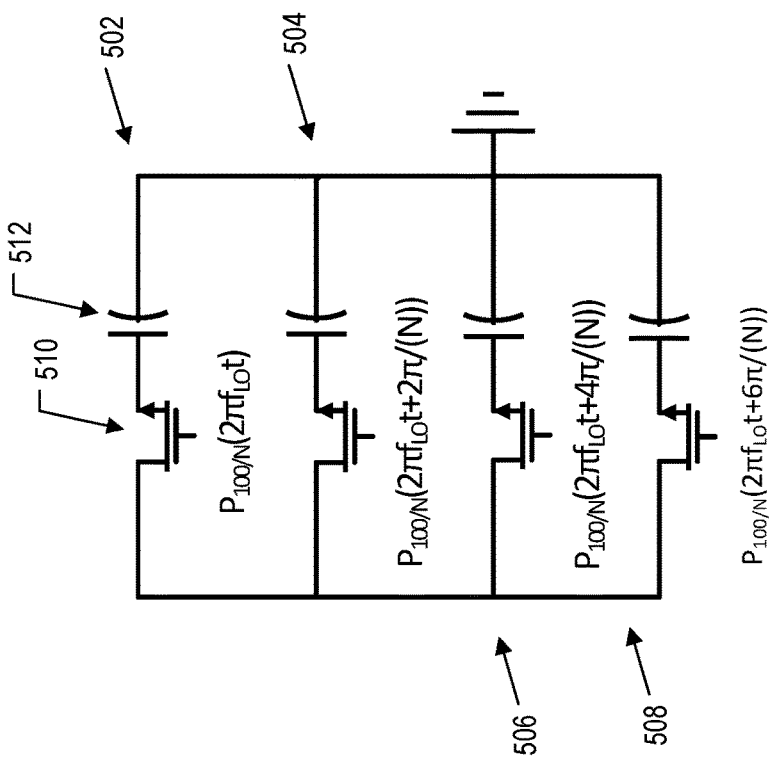

FIG. 5 is a block diagram of an example N-path filter 500 with N=4, in accordance with some embodiments. Referring to FIG. 5, N-path filter 500 includes a plurality of filtering paths, such as filtering paths 502, 504, 506, and 508. Each of the filtering paths 502-508 includes a switch 510 (e.g., a transistor switch or another type of ON/OFF switch) and a capacitor 512 coupled to ground.

In some aspects, four phases at the LO frequency (e.g., at mmW frequency) can be used to drive the filtering paths, where the $P_{100/N}$ stands for a rectangular signal with (100/N) % duty cycle and the appropriate phase argument per phase. In the case of FIG. 5, N=4, or 4 phase branches are used with each branch using a 25% duty cycle rectangular wave, and the waves are also shifted by a quarter period in relation to each other. The N-path filter 500 functions by up-converting the low-pass RC network to a band-pass filter around the clock frequency (e.g., $f_{LO}$). The degrees of freedom in the N-path filter 500 that affect the filter response include the on-resistance of the switch 510 and the on-resistance of the capacitor 512. The number of phases and the overlap determine the noise response and the gain/attenuation of the filter. To synthesize a higher-order filter, multiple parallel and series N-path filters can be summed but with their LO frequencies slightly shifted relative to each other. In such a filter, the number of N-path filters and spacing of the LOs impact the overall synthesized frequency response.

However, it can be challenging to generate a rectangular LO signal with a varying duty cycle in mmW frequencies. There are techniques to obtain some phases (e.g., quadrature), but such techniques can be associated with shortcomings (e.g., area, power, jitter). In some aspects, alternative N-path filter configurations can be used way to accomplish the same functionality at mmW frequency obtained by the N-path filter 500 in FIG. 5 but without the need for multiple mmW frequency rectangular (or with high slew rate) signals. Such example filter configurations are discussed in connection with FIGS. 6-10.

FIG. 6 is a block diagram of an example edge combining sub-harmonic N-path filter 600 with M signal generation branches, in accordance with some embodiments. Referring to FIG. 6, N-path filter 600 includes a plurality of filtering paths, such as N filtering paths 602, 604, 606, 608, . . . . Each of the N filtering paths 602-608 includes a switch 610 (e.g., a transistor switch) and a capacitor 612 coupled to ground. Switches 610 can be driven by LO signals associated with LO frequency (e.g., mmW frequency) where the LO signals are phase-offset (e.g., by 900 in relation to each other). In some aspects, each of the filtering paths includes a plurality of signal generation branches (or paths) that include two or more switches configured to receive a harmonic LO signal based on a fraction of the LO frequency.

For example, filtering path 602 is configured with M signal generation branches 614, 616, 618, 620, 622, . . . that are coupled in parallel with each other and in series with capacitor 612. Each of the signal generation branches 614-622 including switches 624 and 626 coupled in series.

In some aspects, filter 600 can be configured as an RF filter, with the RF signal provided at input terminal 628. In some embodiments, filter 600 can be configured as a down-conversion mixer with the input signal provided at input terminal 628 and the downconverted output provided at signal terminal 630.

As illustrated in FIG. 6, the edge combing sub-harmonic N-path filter 600 can be configured with N effective phases. Each one of the N-path filter phases is in turn constructed out of a composite of M parallel signal generation branches (e.g., branches 614-622) with two transistor switches 624 and 626 in series with each other in each branch. The two transistors of a branch are driven by two 50% duty cycle clocks at a frequency of $f_{in}$(=fLO/M). By adjusting the phase relation between the two clocks as specified in FIG. 6, a rectangular conduction window is in effect created for each of the M-branches that is at the sub-harmonic frequency $f_{in}$ (=$f_{LO}$/M) and a duty cycle of 100/(M*N). Staggering the M parallel branches as shown in FIG. 6 results in a superimposed output with the same behavior as any one of the LO signal phases shown in FIG. 5, resulting in an effective clock frequency of $f_{LO}$. Referred to the output frequency, the duty cycle is the desired (100/N) % but the entire filter architecture only uses the generation of clocks at a fraction (e.g., a sub-harmonic) of the desired frequency ($f_{in}$=$f_{LO}$/M). Extending this to multiple N-path filters for the synthesis of a high-order response uses the generation of multiple clocks around the sub-harmonic and those skilled in the art can use the best approaches for this from a single DPLL input (e.g., using DTC-based carrier shifting).

Figure 7:
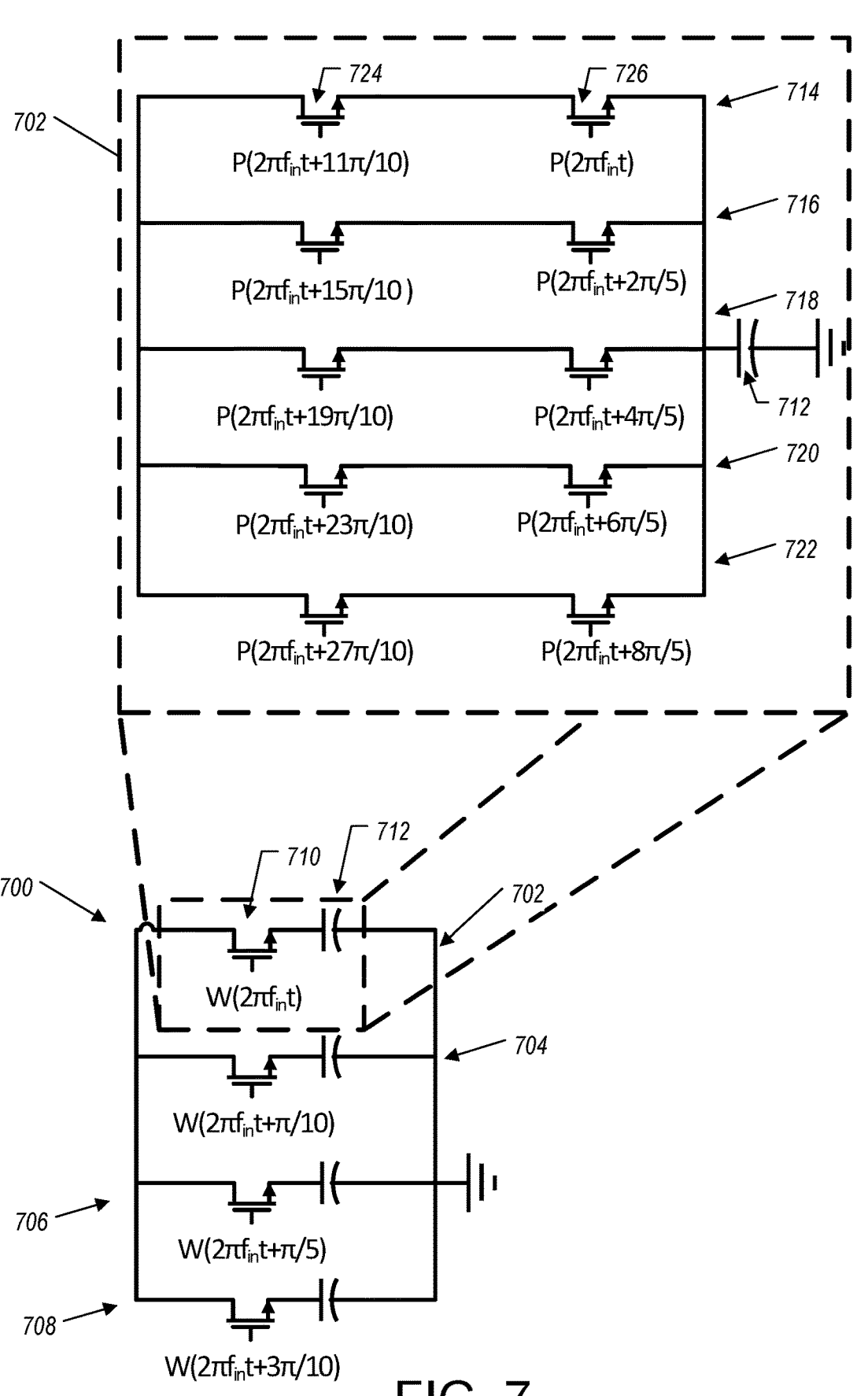
FIG. 7 is a block diagram of an example edge combining sub-harmonic N-path filter with M signal generation branches where N=4 and M=5, in accordance with some embodiments.

In some aspects, a configuration of FIG. 6 with M=5 and N=4 results in the embodiment illustrated in FIG. 7. However, in other aspects, the proposed techniques can be extended to any number of phases and any sub-harmonic frequency ratios to facilitate the optimum synthesis of channel selective band-pass filters at mmW frequencies.

FIG. 7 is a block diagram of an example edge combining sub-harmonic N-path filter 700 with M signal generation branches where N=4 and M=5, in accordance with some embodiments. Referring to FIG. 7, N-path filter 700 includes a plurality of filtering paths, such as filtering paths 702, 704, 706, and 708 (e.g., N=4). Each of the four filtering paths 702-708 includes a switch 710 (e.g., a transistor switch) and a capacitor 712 coupled to ground. Switches 710 can be driven by LO signals associated with LO frequency (e.g., mmW frequency) where the LO signals are phase-offset (e.g., by 90° in relation to each other). In some aspects, each of the filtering paths includes a plurality of signal generation branches (or paths) that include two or more switches configured to receive a harmonic LO signal based on a fraction of the LO frequency.

For example, filtering path 702 is configured with signal generation branches 714, 716, 718, 720, and 722 (e.g. M=5), which are coupled in parallel with each other and in series with capacitor 712. Each of the signal generation branches 714-722 including switches 724 and 726 coupled in series.

Figure 8:
FIG. 8 is a graph of a sub-harmonic N-path filter implementation frequency response (dashed line) against a theoretical expected ideal response (dotted line) for N=4 and M=3 (20 GHz clocks for 60 GHz operation), in accordance with some embodiments.

FIG. 8 is graph 800 of a sub-harmonic N-path filter implementation frequency response (dashed line) against a theoretical expected ideal response (dotted line) for N=4 and M=3 (20 GHz clocks for 60 GHz operation), in accordance with some embodiments. FIG. 8 shows the results of a representative example simulated with an N=4 N-path filter, which at 60 GHz is clocked with 20 GHz sub-harmonic clocks with an intrinsic multiplication factor M=3. The observed frequency response (dashed graph line) is plotted compared to the expected frequency response of an ideal N-path filter (dotted graph line) with an ideal 60 GHz clock assuming that square waveforms with pulse widths of ~4 ps and a period of ~16 ps could be generated. As seen in FIG. 8, the two graph lines match. Generating 60 GHz clocks with these properties can be prohibitively challenging whereas it is feasible to implement the filter using 20 GHz sub-harmonic LO signals (e.g., M=3), 12 GHz sub-harmonic LO signals (e.g., M=5), or 6.67 GHz sub-harmonic LO signals (e.g., M=9) as examples.

Figure 9:
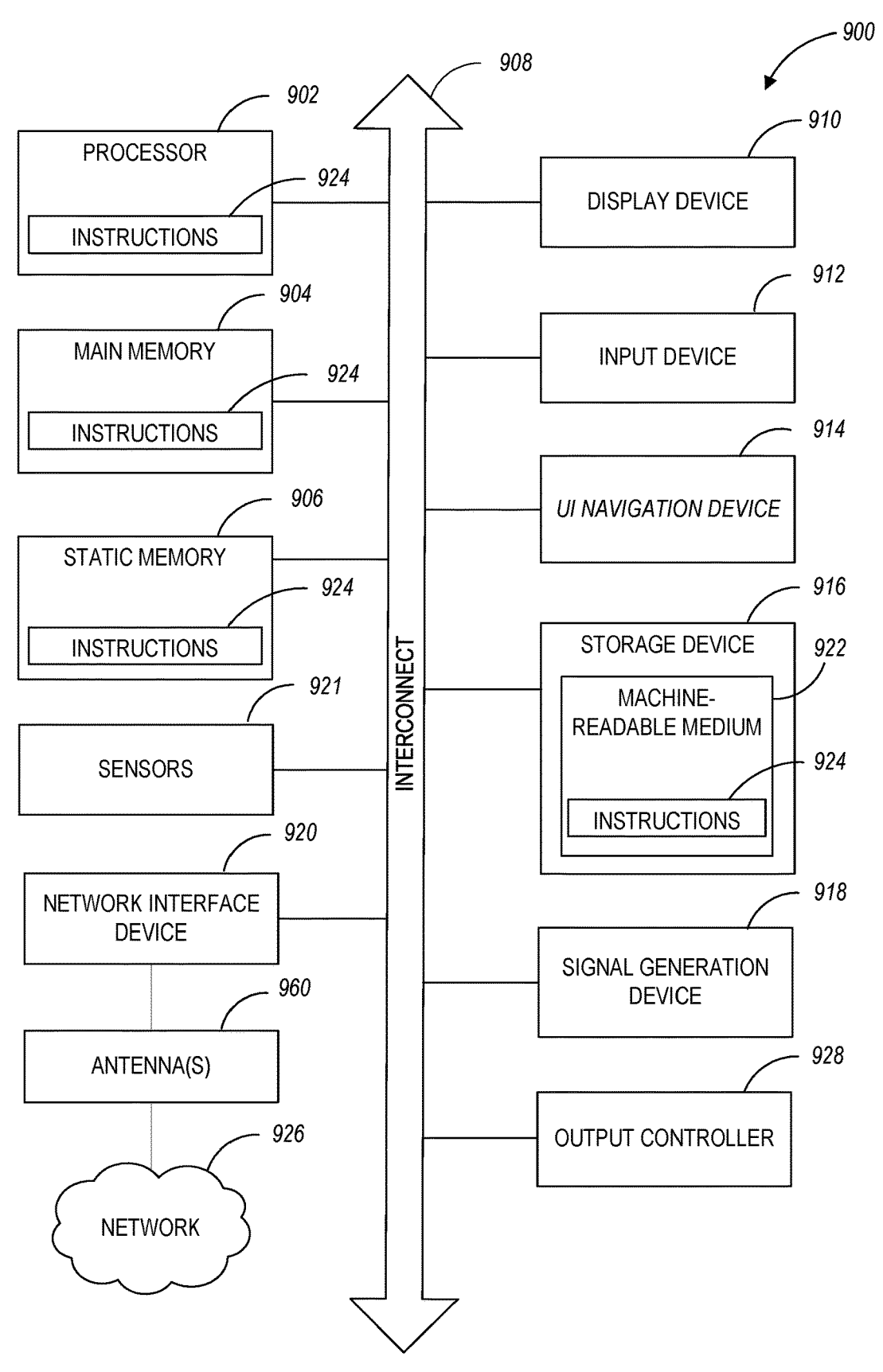
FIG. 9 illustrates a block diagram of an example machine upon which any one or more of the operations/techniques (e.g., methodologies) discussed herein may perform.

FIG. 9 illustrates a block diagram of an example machine 900 upon which any one or more of the techniques (e.g., methodologies) discussed herein may perform. In alternative embodiments, the machine 900 may operate as a standalone device or may be connected (e.g., networked) to other machines. In a networked deployment, machine 900 may operate in the capacity of a server machine, a client machine, or both in server-client network environments. In an example, machine 900 may act as a peer machine in a peer-to-peer (P2P) (or other distributed) network environment. The machine 900 may be a personal computer (PC), a tablet PC, a set-top box (STB), a personal digital assistant (PDA), a portable communications device, a mobile telephone, a smartphone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Machine (e.g., computer system) 900 may include a hardware processor 902 (e.g., a central processing unit (CPU), a graphics processing unit (GPU), a hardware processor core, or any combination thereof), a main memory 904, and a static memory 906, some or all of which may communicate with each other via an interlink (e.g., bus) 908.

Specific examples of main memory 904 include Random Access Memory (RAM), and semiconductor memory devices, which may include, in some embodiments, storage locations in semiconductors such as registers. Specific examples of static memory 906 include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; RAM; and CD-ROM and DVD-ROM disks.

Machine 900 may further include a display device 910, an input device 912 (e.g., a keyboard), and a user interface (UI) navigation device 914 (e.g., a mouse). In an example, the display device 910, input device 912, and UI navigation device 914 may be a touchscreen display. The machine 900 may additionally include a storage device (e.g., drive unit or another mass storage device) 916, a signal generation device 918 (e.g., a speaker), a network interface device 920, and one or more sensors 921, such as a global positioning system (GPS) sensor, compass, accelerometer, or other sensors. The machine 900 may include an output controller 928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). In some embodiments, processor 902 and/or instructions 924 may comprise processing circuitry and/or transceiver circuitry.

The storage device 916 may include a machine-readable medium 922 on which is stored one or more sets of data structures or instructions 924 (e.g., software) embodying or utilized by any one or more of the techniques or functions described herein. The instructions 924 may also reside, completely or at least partially, within the main memory 904, within static memory 906, or within the hardware processor 902 during execution thereof by the machine 900. In an example, one or any combination of the hardware processor 902, the main memory 904, the static memory 906, or the storage device 916 may constitute machine-readable media.

Specific examples of machine-readable media may include non-volatile memory, such as semiconductor memory devices (e.g., EPROM or EEPROM) and flash memory devices; magnetic disks, such as internal hard disks and removable disks; magneto-optical disks; RAM; and CD-ROM and DVD-ROM disks.

While the machine-readable medium 922 is illustrated as a single medium, the term "machine-readable medium" may include a single medium or multiple media (e.g., a centralized or distributed database, and/or associated caches and servers) configured to store one or more instructions 924.

An apparatus of the machine 900 may be one or more of a hardware processor 902 (e.g., a central processing unit (CPU), a graphics processing unit (GPU), a hardware processor core, or any combination thereof), a main memory 904 and a static memory 906, one or more sensors 921, a network interface device 920, antennas 960, a display device 910, an input device 912, a UI navigation device 914, a storage device 916, instructions 924, a signal generation device 918, and an output controller 928. The apparatus may be configured to perform one or more of the methods and/or operations disclosed herein. The apparatus may be intended as a component of machine 900 to perform one or more of the methods and/or operations disclosed herein, and/or to perform a portion of one or more of the methods and/or operations disclosed herein. In some embodiments, the apparatus may include a pin or other means to receive power. In some embodiments, the apparatus may include power conditioning hardware.

The term "machine-readable medium" may include any medium that is capable of storing, encoding, or carrying instructions for execution by the machine 900 and that causes the machine 900 to perform any one or more of the techniques of the present disclosure, or that is capable of storing, encoding or carrying data structures used by or associated with such instructions. Non-limiting machine-readable medium examples may include solid-state memories and optical and magnetic media. Specific examples of machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine-readable media may include non-transitory machine-readable media. In some examples, machine-readable media may include machine-readable media that is not a transitory propagating signal.

The instructions 924 may further be transmitted or received over a communications network 926 using a transmission medium via the network interface device 920 utilizing any one of several transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others.

In an example, the network interface device 920 may include one or more physical jacks (e.g., Ethernet, coaxial, or phone jacks) or one or more antennas to connect to the communications network 926. In an example, the network interface device 920 may include one or more antennas 960 to wirelessly communicate using at least one single-input multiple-output (SIMO), multiple-input multiple-output (MIMO), or multiple-input single-output (MISO) technique. In some examples, the network interface device 920 may wirelessly communicate using Multiple User MIMO techniques. The term "transmission medium" shall be taken to include any intangible medium that is capable of storing, encoding, or carrying instructions for execution by the machine 900, and includes digital or analog communications signals or other intangible media to facilitate communication of such software.

Figure 10:
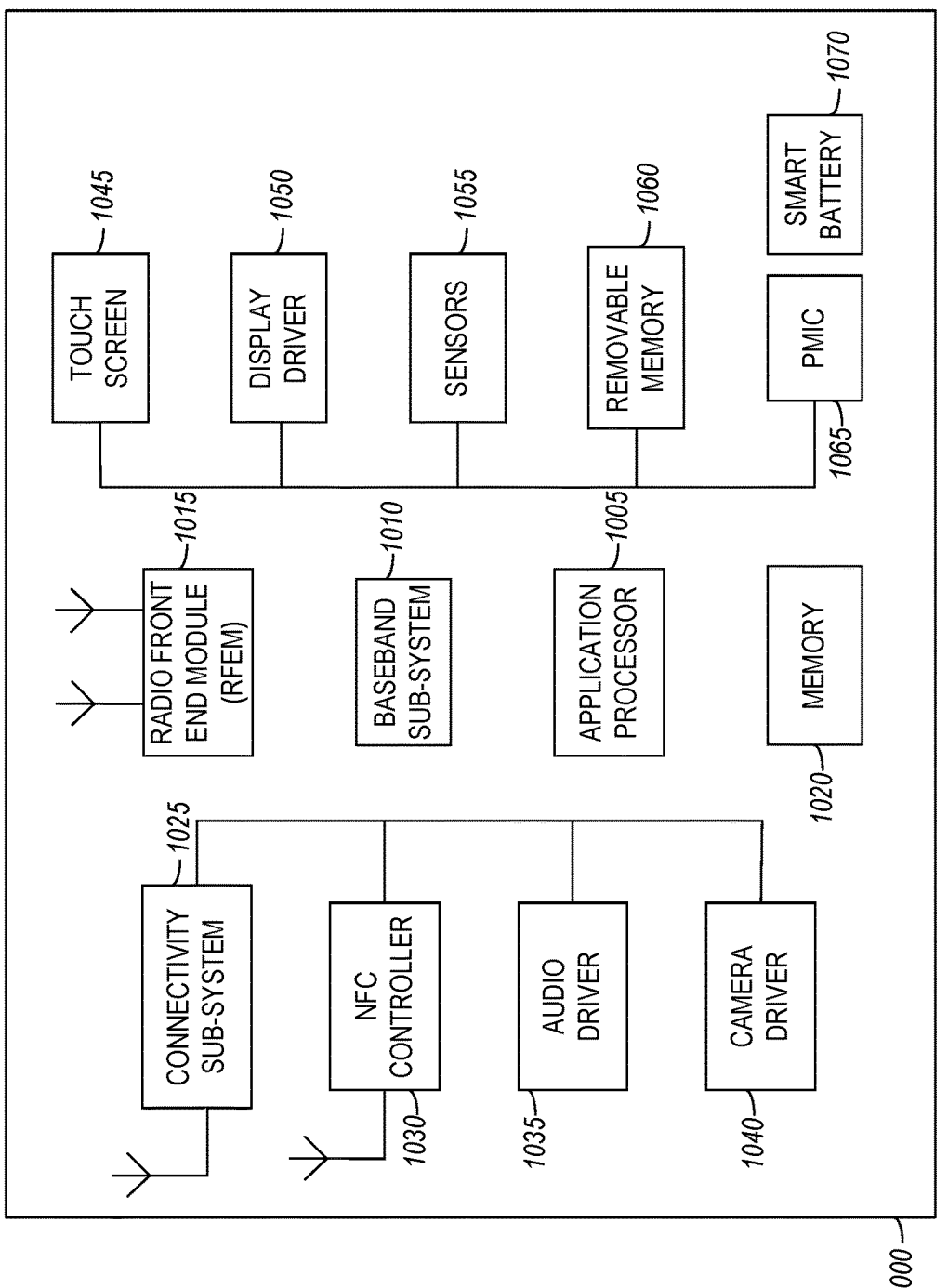
FIG. 10 illustrates an exemplary user device, in which the examples disclosed herein may be implemented.

FIG. 10 illustrates an exemplary user device 1000, in which the examples disclosed herein may be implemented. For example, the examples disclosed herein may be implemented in the radio front-end module (RFEM) 1015, in the baseband sub-system 1010, etc.

The user device 1000 may be a mobile device in some aspects and includes an application processor 1005, baseband processor 1010 (also referred to as a baseband sub-system 1010), RFEM 1015, memory 1020, connectivity sub-system 1025, near-field communication (NFC) controller 1030, audio driver 1035, camera driver 1040, touch screen 1045, display driver 1050, sensors 1055, removable memory 1060, power management integrated circuit (PMIC) 1065, and smart battery 1070.

In some aspects, application processor 1005 may include, for example, one or more central processing unit (CPU) cores and one or more of cache memory, low drop-out voltage regulators (LDOs), interrupt controllers, serial interfaces such as SPI, I2C or universal programmable serial interface sub-system, real-time clock (RTC), timer-counters including interval and watchdog timers, general purpose input/output (I/O), memory card controllers such as SD/MMC or similar, USB interfaces, MIPI interfaces, and/or Joint Test Access Group (JTAG) test access ports.

In some aspects, the baseband sub-system 1010 may be implemented, for example, as a solder-down substrate including one or more integrated circuits, a single packaged integrated circuit soldered to the main circuit board, and/or a multi-chip module including two or more integrated circuits.

Figure 11:
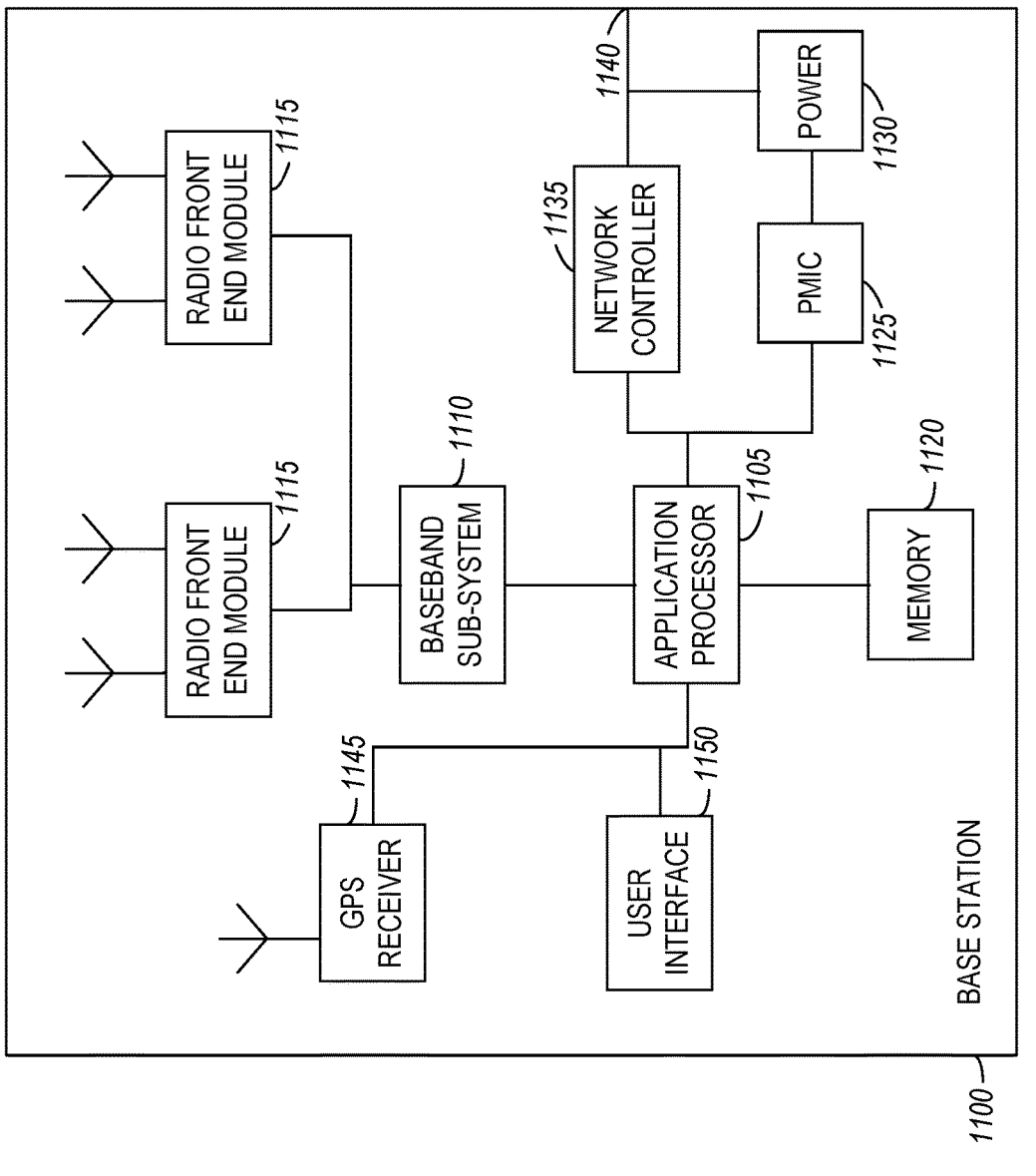
FIG. 11 illustrates an exemplary base station (or infrastructure equipment radio head), in which the examples disclosed herein may be implemented.

FIG. 11 illustrates an exemplary base station (or infrastructure equipment radio head) 1100, in which the examples disclosed herein may be implemented. For example, the examples disclosed herein may be implemented in the radio front-end modules (RFEMs) 1115, in the baseband sub-system 1110, etc.

The base station 1100 may include one or more of application processor 1105, at least one baseband processor 1110 (also referred to as a baseband sub-system 1110), RFEMs 1115, memory 1120, power management integrated circuitry (PMIC) 1125, power circuitry 1130, network controller 1135, network interface connector 1140, satellite navigation receiver (e.g., GPS receiver) 1145, and user interface 1150.

In some aspects, application processor 1105 may include one or more CPU cores and one or more of cache memory, low drop-out voltage regulators (LDOs), interrupt controllers, serial interfaces such as SPI, I2C, or universal programmable serial interface, real-time clock (RTC), timer-counters including interval and watchdog timers, general purpose IO, memory card controllers such as SD/MMC or similar, USB interfaces, MIPI interfaces, and Joint Test Access Group (JTAG) test access ports.

In some aspects, the baseband sub-system 1110 may be implemented, for example, as a solder-down substrate including one or more integrated circuits, a single packaged integrated circuit soldered to the main circuit board, or a multi-chip sub-system including two or more integrated circuits.

In some aspects, memory 1120 may include one or more volatile memory including dynamic random access memory (DRAM) and/or synchronous DRAM (SDRAM), and non-volatile memory (NVM) including high-speed electrically erasable memory (commonly referred to as Flash memory), phase-change random access memory (PRAM), magnetoresistive random access memory (MRAM), and/or a three-dimensional crosspoint memory. Memory 1120 may be implemented as one or more solder-down packaged integrated circuits, socketed memory modules, and plug-in memory cards.

In some aspects, PMIC 1125 may include one or more voltage regulators, surge protectors, power alarm detection circuitry, and one or more backup power sources such as a battery or capacitor. Power alarm detection circuitry may detect one or more brownout (under-voltage) and surge (over-voltage) conditions.

In some aspects, power circuitry 1130 may provide electrical power drawn from a network cable. Power circuitry 1130 may provide both power supply and data connectivity to the base station 1100 using a single cable.

In some aspects, network controller 1135 may provide connectivity to a network using a standard network interface protocol such as Ethernet. Network connectivity may be provided using a physical connection which is one electrical (commonly referred to as copper interconnect), optical or wireless.

In some aspects, satellite navigation receiver 1145 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1145 may provide, to application processor 1105, data which may include one or more of position data or time data. Time data may be used by application processor 1105 to synchronize operations with other radio base stations or infrastructure equipment.

In some aspects, user interface 1150 may include one or more buttons. The buttons may include a reset button. User interface 1150 may also include one or more indicators such as LEDs and a display screen.

Examples, as described herein, may include, or may operate on, logic or several components, modules, or mechanisms. Modules are tangible entities (e.g., hardware) capable of performing specified operations and may be configured or arranged in a certain manner. In an example, circuits may be arranged (e.g., internally or concerning external entities such as other circuits) in a specified manner as a module. In an example, the whole or part of one or more computer systems (e.g., a standalone, client, or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using the software, the general-purpose hardware processor may be configured as respective different modules at different times. The software may accordingly configure a hardware processor, for example, to constitute a particular module at one instance of time and to constitute a different module at a different instance of time.

Some embodiments may be implemented fully or partially in software and/or firmware. This software and/or firmware may take the form of instructions contained in or on a non-transitory computer-readable storage medium. Those instructions may then be read and executed by one or more processors to enable the performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read-only memory (ROM); random access memory (RAM); magnetic disk storage media; optical storage media; flash memory, etc.

The above-detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof) or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) is supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in many environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, although the scope of the disclosure is not limited in this respect.

Antennas referred to herein may comprise one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each of the antennas and the antennas of a transmitting station. In some MIMO embodiments, antennas may be separated by up to $\frac{1}{10}$ of a wavelength or more.

Described implementations of the subject matter can include one or more features, alone or in combination as illustrated below by way of examples.

Example 1 is a band-pass filter comprising: a plurality of filtering paths coupled in parallel, the plurality of filtering paths being driven by a corresponding plurality of local oscillator (LO) signals associated with an LO frequency, each of the LO signals having a phase of a plurality of phases; and each filtering path of the plurality of filtering paths comprising a plurality of signal generation branches, the plurality of signal generation branches configured to receive a harmonic LO signal based on a fraction of the LO frequency, and generate an LO signal of the corresponding plurality of LO signals associated with the LO frequency using the harmonic LO signal.

In Example 2, the subject matter of Example 1 includes subject matter where the plurality of phases includes non-overlapping phases spaced at substantially 900 apart from each other.

In Example 3, the subject matter of Examples 1-2 includes subject matter where each filtering path of the plurality of filtering paths comprises a switch and a capacitor coupled in series.

In Example 4, the subject matter of Example 3 includes subject matter where each signal generation branch of the plurality of signal generation branches of the filtering path comprises two switches coupled in series with each other.

In Example 5, the subject matter of Example 4 includes subject matter where the plurality of signal generation branches of the filtering path are coupled in parallel with each other and in series with the capacitor.

In Example 6, the subject matter of Examples 4-5 includes subject matter where the plurality of signal generation branches of the filtering path are configured to generate a plurality of signal pulses based on the harmonic LO signal.

In Example 7, the subject matter of Example 6 includes subject matter where each of the two switches of the signal generation branch is driven by a version of the harmonic LO signal, to generate at least two of the plurality of signal pulses.

In Example 8, the subject matter of Examples 6-7 includes subject matter where periodicity of the plurality of signal pulses is the same as periodicity of the plurality of LO signals.

In Example 9, the subject matter of Examples 3-8 includes a signal input port configured at the input of the switch, the signal input port to receive an input radio frequency (RF) signal for filtering.

In Example 10, the subject matter of Example 9 includes subject matter where the RF signal is a signal in a millimeter wave (mmWave) frequency band.

Example 11 is an apparatus for a wireless device, the apparatus comprising: a frequency synthesizer; and radio front-end (RFE) circuitry coupled to the frequency synthesizer, the RFE circuitry including an N-path filter, the N-path filter comprising a plurality of filtering paths being driven by a corresponding plurality of local oscillator (LO) signals associated with an LO frequency, each filtering path of the plurality of filtering paths comprising a plurality of signal generation branches, the plurality of signal generation branches in the filtering path configured to receive a harmonic LO signal generated by the frequency synthesizer, the harmonic LO signal based on a fraction of the LO frequency; and generate an LO signal of the corresponding plurality of LO signals associated with the LO frequency using the harmonic LO signal.

In Example 12, the subject matter of Example 11 includes subject matter where the plurality of phases includes non-overlapping phases spaced at substantially 900 apart from each other.

In Example 13, the subject matter of Examples 11-12 includes subject matter where the plurality of filtering paths are coupled in parallel, and wherein each filtering path of the plurality of filtering paths comprises a switch and a capacitor coupled in series.

In Example 14, the subject matter of Example 13 includes subject matter where each signal generation branch of the plurality of signal generation branches of the filtering path comprises two switches coupled in series with each other.

In Example 15, the subject matter of Example 14 includes subject matter where the plurality of signal generation branches of the filtering path are coupled in parallel with each other and in series with the capacitor.

In Example 16, the subject matter of Examples 14-15 includes subject matter where the plurality of signal generation branches of the filtering path are configured to generate a plurality of signal pulses based on the harmonic LO signal.

In Example 17, the subject matter of Example 16 includes subject matter where each of the two switches of the signal generation branch is driven by a version of the harmonic LO signal, to generate at least two of the plurality of signal pulses.

In Example 18, the subject matter of Examples 16-17 includes subject matter where periodicity of the plurality of signal pulses is the same as periodicity of the plurality of LO signals.

In Example 19, the subject matter of Examples 13-18 includes, a signal input port configured at the input of the switch, the signal input port to receive an input radio frequency (RF) signal for filtering.

Example 20 is a downconversion mixer comprising: a plurality of filtering paths coupled in parallel, each filtering path of the plurality of filtering paths comprising a switch and a capacitor coupled in series, the plurality of filtering paths being driven by a corresponding plurality of local oscillator (LO) signals associated with an LO frequency, each of the LO signals having a phase of a plurality of non-overlapping phases spaced at substantially 900 apart from each other; wherein each filtering path of the plurality of filtering paths comprising a plurality of signal generation branches; wherein each signal generation branch of the plurality of signal generation branches of the filtering path comprising two switches coupled in series with each other; and wherein the plurality of signal generation branches is configured to: receive a harmonic LO signal based on a fraction of the LO frequency; generate an LO signal of the corresponding plurality of LO signals associated with the LO frequency using the harmonic LO signal, and downconvert an input radio frequency (RF) signal received by the switch of the filtering path; and provide a downconverted signal corresponding to the input RF signal at an input of the capacitor of the filtering path.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

Example 23 is a system to implement any of Examples 1-20.

Example 24 is a method to implement any of Examples 1-20.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined regarding the appended claims, along with the full scope of equivalents to which such claims are entitled.

What is claimed is:

1. A band-pass filter comprising:
a plurality of filtering paths, the plurality of filtering paths being driven by a corresponding plurality of local oscillator (LO) signals associated with an LO frequency, each of the LO signals having a phase of a plurality of phases; and
each filtering path of the plurality of filtering paths comprising a plurality of signal generation branches, the plurality of signal generation branches configured to receive a harmonic LO signal based on a fraction of the LO frequency, and generate an LO signal of the corresponding plurality of LO signals associated with the LO frequency using the harmonic LO signal.

2. The band-pass filter of claim 1, wherein the plurality of phases include non-overlapping phases spaced at substantially 900 apart from each other.

3. The band-pass filter of claim 1, wherein each filtering path of the plurality of filtering paths comprises a switch and a capacitor coupled in series.

4. The band-pass filter of claim 3, wherein each signal generation branch of the plurality of signal generation branches of the filtering path comprises two switches coupled in series with each other.

5. The band-pass filter of claim 4, wherein the plurality of signal generation branches of the filtering path are coupled in parallel with each other and in series with the capacitor.

6. The band-pass filter of claim 4, wherein the plurality of signal generation branches of the filtering path are configured to generate a plurality of signal pulses based on the harmonic LO signal.

7. The band-pass filter of claim 6, wherein each of the two switches of the signal generation branch is driven by a version of the harmonic LO signal, to generate at least two of the plurality of signal pulses.

8. The band-pass filter of claim 6, wherein periodicity of the plurality of signal pulses is the same as periodicity of the plurality of LO signals.

9. The band-pass filter of claim 3, further comprising:
a signal input port configured at the input of the switch, the signal input port to receive an input radio frequency (RF) signal for filtering.

10. The band-pass filter of claim 9, wherein the RF signal is a signal in a millimeter wave (mmWave) frequency band.

11. An apparatus for a wireless device, the apparatus comprising:
a frequency synthesizer; and
radio front-end (RFE) circuitry coupled to the frequency synthesizer, the RFE circuitry including an N-path filter, the N-path filter comprising a plurality of filtering paths being driven by a corresponding plurality of local oscillator (LO) signals associated with an LO frequency, each filtering path of the plurality of filtering paths comprising a plurality of signal generation branches, the plurality of signal generation branches in the filtering path configured to:
receive a harmonic LO signal generated by the frequency synthesizer, the harmonic LO signal based on a fraction of the LO frequency; and
generate an LO signal of the corresponding plurality of LO signals associated with the LO frequency using the harmonic LO signal.

12. The apparatus of claim 11, wherein each of the LO signals is associated with a phase of a plurality of phases, and wherein the plurality of phases include non-overlapping phases spaced at substantially 900 apart from each other.

13. The apparatus of claim 11, wherein the plurality of filtering paths are coupled in parallel, and wherein each filtering path of the plurality of filtering paths comprises a switch and a capacitor coupled in series.

14. The apparatus of claim 13, wherein each signal generation branch of the plurality of signal generation branches of the filtering path comprises two switches coupled in series with each other.

15. The apparatus of claim 14, wherein the plurality of signal generation branches of the filtering path are coupled in parallel with each other and in series with the capacitor.

16. The apparatus of claim 14, wherein the plurality of signal generation branches of the filtering path are configured to generate a plurality of signal pulses based on the harmonic LO signal.

17. The apparatus of claim 16, wherein each of the two switches of the signal generation branch is driven by a version of the harmonic LO signal, to generate at least two of the plurality of signal pulses.

18. The apparatus of claim 16, wherein periodicity of the plurality of signal pulses is the same as periodicity of the plurality of LO signals.

19. The apparatus of claim 13, further comprising:
a signal input port configured at the input of the switch, the signal input port to receive an input radio frequency (RF) signal for filtering.

20. A downconversion mixer comprising:
a plurality of filtering paths, each filtering path of the plurality of filtering paths comprising a switch and a capacitor, the plurality of filtering paths being driven by a corresponding plurality of local oscillator (LO) signals associated with an LO frequency, each of the LO signals having a phase of a plurality of non-overlapping phases spaced at substantially 900 apart from each other;
wherein each filtering path of the plurality of filtering paths comprising a plurality of signal generation branches;
wherein each signal generation branch of the plurality of signal generation branches of the filtering path comprising two switches coupled in series with each other; and
wherein the plurality of signal generation branches is configured to:
receive a harmonic LO signal based on a fraction of the LO frequency;
generate an LO signal of the corresponding plurality of LO signals associated with the LO frequency using the harmonic LO signal, and downconvert an input radio frequency (RF) signal received by the switch of the filtering path; and
provide a downconverted signal corresponding to the input RF signal at an input of the capacitor of the filtering path.

* * * * *